United States Patent [19]

Ismail

[11] Patent Number: 5,329,257

[45] Date of Patent: Jul. 12, 1994

[54] SIGE TRANSFERRED ELECTRON DEVICE AND OSCILLATOR USING SAME

[75] Inventor: Khaled E. Ismail, Cairo, Egypt

[73] Assignee: International Business Machines Corproation, Armonk, N.Y.

[21] Appl. No.: 56,153

[22] Filed: Apr. 30, 1993

[51] Int. Cl.$^5$ .......................... H01L 27/26; H03B 9/12
[52] U.S. Cl. .................................. 331/107 G; 257/6; 257/7; 257/627
[58] Field of Search ................... 331/107 G; 257/6, 7, 257/19, 22, 627

[56] References Cited

U.S. PATENT DOCUMENTS

| | | | |
|---|---|---|---|
| 3,480,879 | 11/1969 | Nathan et al. | 331/107 G |
| 3,602,841 | 8/1971 | McGroddy | 331/107 G |
| 3,626,257 | 12/1971 | Esaki | 257/15 |
| 3,626,328 | 12/1971 | Esaki | 331/107 G |
| 3,900,881 | 8/1975 | Katayama et al. | 331/107 G X |
| 4,182,964 | 1/1980 | Kataoka et al. | 331/107 G X |
| 4,222,014 | 9/1980 | Ondria | 331/107 DP |
| 4,661,829 | 4/1987 | Bean et al. | 257/20 |
| 4,772,924 | 9/1988 | Bean et al. | 257/19 |
| 4,843,028 | 6/1989 | Herzog et al. | 437/81 |
| 4,959,694 | 9/1990 | Gell | 257/13 |
| 5,155,571 | 10/1992 | Wang et al. | 257/19 |

OTHER PUBLICATIONS

S. S. Iyer et al. "Optimal Growth Technique and Structure for Strain Relaxation . . . " IBM Tech. Discl. Bull. vol. 32, No. 8A, Jan. 1990, pp. 330-331.

S. S. Iyer et al. "Electron Tunneling Structures Using Strain Engineered . . . " IBM Tech. Discl. Bull. vol. 34, No. 4A, Sep., 1991, pp. 411-413.

*Primary Examiner*—Siegried H. Grimm
*Attorney, Agent, or Firm*—Blaney Harper; Robert M. Trepp

[57] ABSTRACT

This invention is a three layer $Si_xGe_{1-x}$ structure formed on a silicon substrate in which a thin, lightly doped $Si_xGe_{1-x}$ layer is formed between two heavily doped $Si_xGe_{1-x}$ layers. The incorporation of at least 10% germanium in the silicon provides for intervalley scattering of carriers in the conduction band of the $Si_xGe_{1-x}$ layers. This intervalley scattering leads to the negative differential conductance necessary for transferred electron device (TED) operation. Additionally, the lightly doped $Si_xGe_{1-x}$ layer is made very thin, on the order of 2,000 to 7,000 Angstroms, and the current flow through the this layer is vertical so that a high electric field can be placed across the lightly doped layer without applying a high voltage across the lightly doped layer. The lightly doped layer can be made thin even though it is interposed between two heavily doped layers because the growth of the in-situ doped $Si_xGe_{1-x}$ layers is carried out at a temperature of less than approximately 600° C. When the growth of the $Si_xGe_{1-x}$ layers is done in this temperature range, then there is no outdiffusion of the dopants from the heavily doped layers into the lightly doped layers and abrupt doping profiles are maintained even over relatively short distances in the layers. The TED can be connected to an RLC network formed on the silicon substrate to form an integrated oscillator circuit.

10 Claims, 2 Drawing Sheets

SIGE TRANSFERRED ELECTRON DEVICE AND OSCILLATOR USING SAME

FIELD OF INVENTION

This invention relates generally to the field of semiconductor devices. In particular, this invention relates to a transferred electron device formed of a silicon germanium compound. More specifically, this invention relates to an oscillator formed from a silicon germanium transferred electron device.

BACKGROUND OF THE INVENTION

The transferred electron device (TED) has been used extensively in oscillator and power amplifier circuits. The TED provides the oscillator function in these circuits covering the microwave frequency range of typically 1 to 100 GHz. The oscillator and power amplifier circuits are important for many applications such as radar, intrusion alarms, microwave test instruments, and a variety of communication devices. The TED is particularly useful in these types of applications because of the solid state nature of the device which provides reliability and low cost, two features which are critical to the practical implementation of the electronic functions.

The solid state TED generates coherent microwave output power because the device has a negative differential conductance. The TED is typically comprised of doped semiconductor material which has a voltage applied that generates an electric field across a region of the semiconductor material. The voltage and width of the region are such that the electric field exceeds a critical value which is dependant on the type of semiconductor material used. The negative differential conductance is based on the phenomena that when carriers in the conduction band of the TED are accelerated by this electric field they undergo collisions with the lattice structure of the semiconductor material. These collisions transfer the carrier from a conduction band having a first energy level to a conduction band having a second, and higher, energy level. As carriers make the transition from the low energy conduction band to the higher energy conduction band in which carriers have a higher effective mass, their velocity is decreased with respect to the carriers which have not undergone the transition. As a result, carriers build up within the TED forming a charge dipole and decreasing current flow through the TED. The electric field applied to the TED then sweeps the charge dipole out of the TED which temporarily increases the current density for the applied electric field. Once the charge dipole has been swept out, the cycle of building up the charge dipole and sweeping it out begins again. The temporary decrease in current density is periodic in nature, and produces the oscillating behavior of the TED.

Conventional TEDs have been formed from a variety of semiconductor materials including GaAs, InP, CdTe, InAs, Ge, InSb, ZnSe, GaInSb, InAsP, and GainAsP. Typically, these materials in bulk form are placed between contacts to form the TED. The problem with forming a TED from these types of materials is that these materials are difficult to integrate with conventional electronic devices formed in silicon. In particular, when such materials are deposited on silicon, by a process such as chemical vapor deposition, the resulting films typically have numerous defects due to the lattice mismatch between the deposited films and silicon. The numerous defects preclude the formation of the TED useless. Also, when the TEDs are formed in a bulk material and then manually bonded to a silicon substrate, the integration of the TED and the silicon integrated circuit is expensive because of the manual labor cost. The manual placement of the TED on the silicon integrated circuit is also not desirable because of the low level of integration which can be achieved by manual placement of the TED. Moreover, a TED fabricated in bulk material requires a relatively high applied voltage in order to form an electric field having a sufficient magnitude to create the negative differential conductance effect. This is because the TED device must be very thick to accomodate the doped regions associated with the TED contacts. A high applied voltage is not desirable for a TED integrated in a silicon circuit because the silicon circuits typically use a low applied voltage.

OBJECTS OF THE INVENTION

It is an object of the present invention to manufacture an improved TED.

It is another object of the present invention to manufacture an improved low voltage TED.

It is a further object of the present invention to manufacture an improved low voltage TED which may be integrated into silicon electronic circuits.

It is still another object of the present invention to manufacture an improved low voltage TED which may be inexpensively integrated into silicon electronic circuits.

It is still a further object of the present invention to manufacture an improved low voltage oscillator circuit which incorporates a TED integrated with a silicon substrate.

SUMMARY

The present invention is a three layer $Si_xGe_{1-x}$ structure formed on a silicon substrate in which a thin, lightly doped $Si_xGe_{1-x}$ layer is formed between two heavily doped $Si_xGe_{1-x}$ layers. The incorporation of at least 10% germanium in the silicon provides for intervalley scattering of carriers in the conduction band of the $Si_xGe_{1-x}$ layers. This intervalley scattering leads to the negative differential conductance necessary for transferred electron device (TED) operation. Additionally, the lightly doped $Si_xGe_{1-x}$ layer is made very thin, on the order of 2,000 to 7,000 Angstroms, and the current flow through the this layer is vertical so that a high electric field can be placed across the lightly doped layer without applying a high voltage across the lightly doped layer. The lightly doped layer can be made thin even though it is interposed between two heavily doped layers because the growth of the in-situ doped $Si_xGe_{1-x}$ layers is carried out at a temperature of less than approximately 600° C. When the growth of the $Si_xGe_{1-x}$ layers is done in this temperature range, then there is no outdiffusion of the dopants from the heavily doped layers into the lightly doped layers and abrupt doping profiles are maintained even over relatively short distances in the layers.

DESCRIPTION OF THE PREFERRED EMBODIMENT

Figure 1:
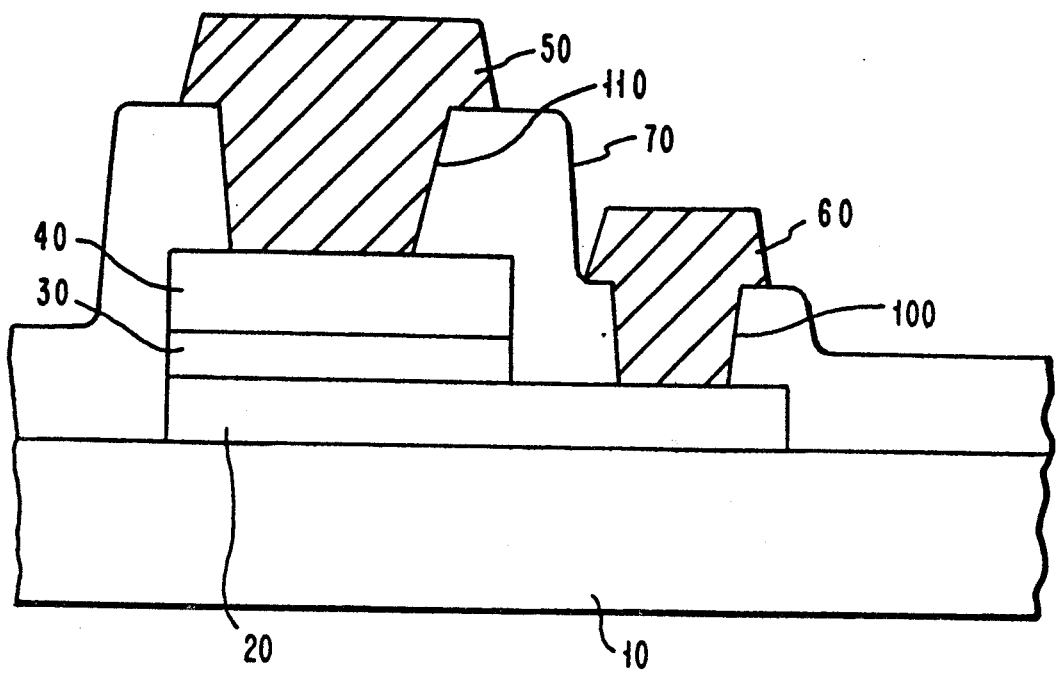
FIG. 1 illustrates one embodiment of a transferred electron device according to the present invention.

FIG. 1 illustrates an embodiment of the present invention. A three layer silicon germanium (SiGe) structure is formed on a plane of a single crystal silicon substrate 10 substantially perpendicular to a <100> crystal orientation of said silicon substrate. A first $Si_xGe_{1-x}$ 20 layer formed on the plane of the silicon substrate 10 substantially perpendicular to the <100> crystal orientation has the same crystal orientation as the underlying silicon substrate 10 because the $Si_xGe_{1-x}$ layer 20 is epitaxially formed on the silicon substrate 10. When the silicon substrate 10 has a different crystal orientation than <100>, which is replicated in the layer 20, then the frequency characteristics of the integrated transferred electron device formed by depositing the three layer silicon germanium structure on the silicon substrate will be degraded (lower frequency and amplitude depending on the extent of the deviation from the <100> direction) but the device will still oscillate. The first $Si_xGe_{1-x}$ 20 layer which is formed on the silicon substrate 10 has a composition of greater than approximately 10% (+/−10%) germanium. That is x is less than or equal to about 0.9. Layer 20 also has a thickness of greater than approximately 100 Angstroms (+/−10%) and an N-type doping level of greater than approximately $10^{18}/cm^3$ (+/−10%), preferably $5 \times 10^{19}/cm^3$.

The first $Si_xGe_{1-x}$ layer 20 is epitaxially formed on the substrate 10 such that the first layer 20 has a single crystal lattice structure. The second $Si_xGe_{1-x}$ layer 30 is epitaxially formed on the first layer 20 such that it also has a single crystal lattice structure having the same crystal orientation as the first layer 20 and with approximately the same amount of germanium as the first layer 20. The second layer 30 is at least approximately 2,000 Angstroms thick and may be as thick as 20 microns or more. Preferably the thickness of the second layer 30 is in the range of 2,000 Angstroms to 7,000 Angstroms. The doping of the second layer 30 is of the same type (N) as the first layer 20, however, the doping level is significantly lower. In particular, the doping level of the second layer 30 is approximately 10 times less than the first layer 20. The doping of the second layer is less than approximately $10^{17}/cm^3$. The third $Si_xGe_{1-x}$ layer 40 is formed on top of the second layer 30. The third layer is epitaxially grown on the second layer 30 such that it has a single crystal lattice structure. The doping type, doping concentration, and thickness of the third layer 40 is similar to the first layer 20.

The three layer $Si_xGe_{1-x}$ structure has a lightly doped second layer interposed between two higher doped layers. Each of the higher doped layers has an electrical contact attached to the corresponding layer. Contact 50 is attached to the third layer 40 and contact 60 is attached to the first layer 20. In this embodiment of the invention, the first layer 20 has a greater area than the second or third layers so that the contact 60 can be attached to the surface of the first layer which forms the interface between the first and second layers. More particularly, three $Si_xGe_{1-x}$ layers are initially grown on the silicon substrate 10 all having the same area. Once grown, a conventional photolithography and etching step is performed on the three layer structure to define a contact area to layer 20. Layers 30 and 40 are etched away in the contact area of layer 20 during these photolithography and etching steps. Once the contact area of layer 20 is exposed, contacts 50 and 60 are formed.

During the operation of a TED as contemplated by this embodiment of the invention, a voltage is applied between contacts 50 and 60. The voltage (V) creates an electric field across the second layer 40 and the magnitude of the electric field is related to the voltage through the relationship $E=V/d$ where d is the thickness of the second layer. When the doping of the $Si_xGe_{1-x}$ structure is N type, electrons are accelerated across the second layer 40 by the electric field. The accelerated electrons undergo collisions with the lattice structure of the TED. Some of the electrons which undergo such collisions are transferred from a low energy conduction state to a higher level energy conduction state having higher effective mass in the conduction band as illustrated in FIG. 2.

Figure 2:
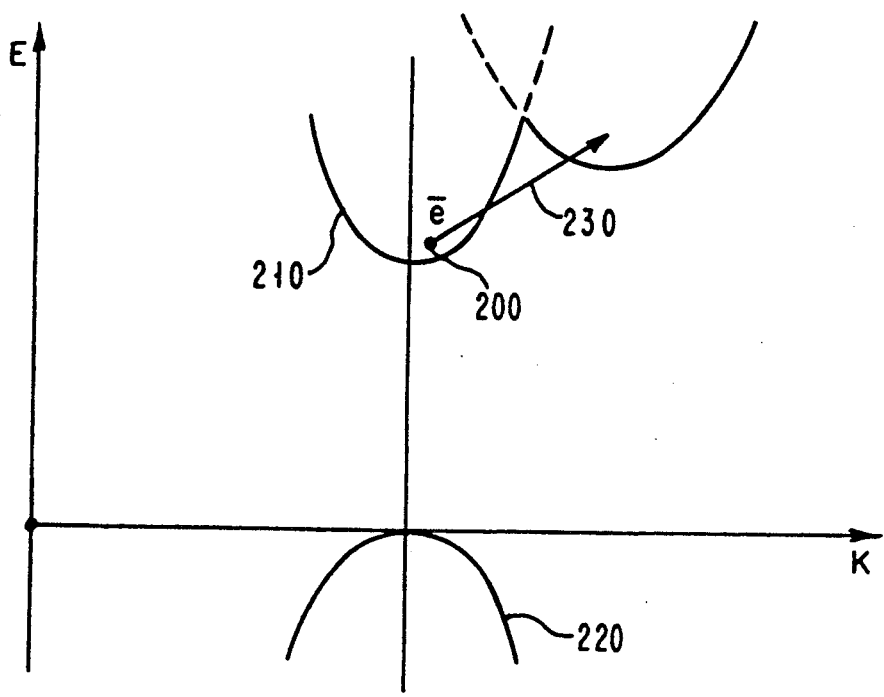
FIG. 2 illustrates an energy band diagram of a transferred electron device according to the present invention.

FIG. 2 illustrates the energy level (E) of electrons in the conduction band 210 and valance band 220 plotted against the momentum (k) in a $Si_xGe_{1-x}$ layer. Electrons 200 are transferred from the low effective mass low energy conduction state to the high effective mass high energy conduction state after collision with the lattice structure. Those electrons which are transferred to the higher energy conduction state have a higher effective mass and are transferred across the TED by the electric field at a lower velocity than those electrons which have not been transferred into the higher energy conduction state. This results in a local charge layer within the TED which is swept out of the TED by the electric field. When the charge layer is swept out of the TED, there is a transitory increase in current density from the TED. Once the TED has swept out the local charge layer, another charge layer forms and is swept out, creating a periodic current density in the TED. The TED doping must be N-type in order to take advantage of the shape of the conduction band versus momentum plot in the $Si_xGe_{1-x}$ material.

Figure 3:
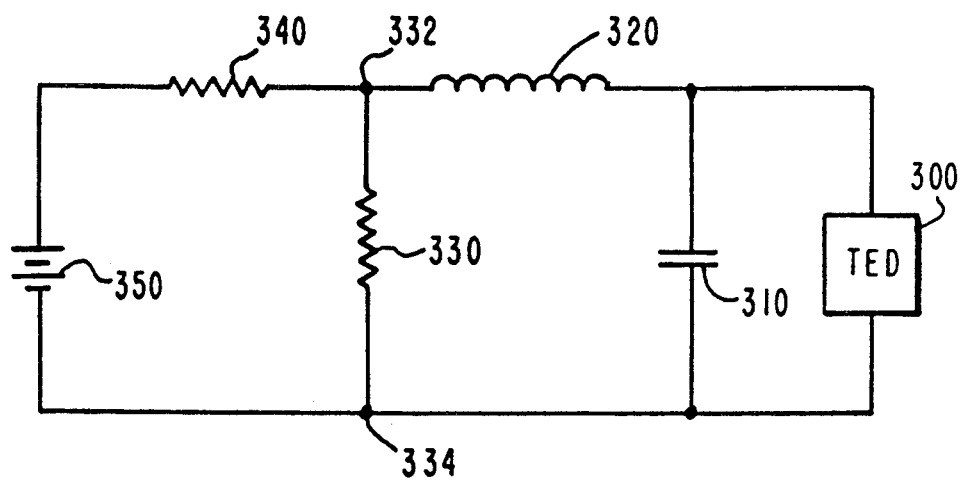
FIG. 3 illustrates an oscillator circuit incorporating a transferred electron device according to the present invention.

FIG. 3 illustrates a generalized oscillator circuit incorporating a TED according to this invention. In general the TED 300 is connected to a voltage source 350 through a distributed network of electrical elements such as inductor 320, capacitor 310, and resistors 340, and 330. The oscillator circuit produces an oscillating voltage across resistor 330 which has a frequency determined by the values of the resistor, inductor, and capacitor elements. Resistor 330 is a load resistor connected across the output port formed between nodes 332 and 334 in this embodiment of the oscillator circuit. The choices of particular electrical element values and manner in which the electrical elements are connected to the TED are choices which are well known in the art of making oscillator circuits. The output frequency of the oscillating circuit can then be tuned to different frequencies by adjusting the values of the resistors, capacitors, and inductors. The oscillator circuit primarily determines the frequency of the TED because the second layer 30 of the TED is thin enough so that the transition time to sweep out the local charge layer is small compared to the time period of the resonant frequency of the oscillator circuit. The TED of the present embodiment of this invention has an oscillation frequency range of between 1 and 100GHz, depending on the thickness of the second layer 30 and electric field applied to the TED, because the transit time of carriers across this lightly doped $Si_xGe_{1-x}$ layer is small.

The second layer 30 of the TED of the present invention may be thin, on the order of 2,000 Angstroms, in combination with the heavy doping of the first and third layers of the TED in a single crystal structure formed on a silicon substrate because the three $Si_xGe_{1-x}$ layers are deposited at a low temperature. When the three layers are deposited at a temperature below 600 degrees Celsius, there is minimal outdiffusion of the dopants between layers having significantly different doping levels. The epitaxial formation of the $Si_xGe_{1-x}$ layers occurs in an Ultra-High Vacuum Chemical Vapor Deposition (UHV/CVD) apparatus in which an initial base pressure of less than $10^{-8}$ Torr is developed having a partial pressure of all contaminants (specifically oxygen and hydrogen) of less than $10^{-7}$ Torr in the deposition chamber. The silicon substrates are placed in the chamber and the chamber is heated to less than approximately 600° C. while appropriate amounts of silane, germane, and/or dopant species are introduced into the chamber. The determination of the amounts of silane, germane, and/or dopant is a matter well known to those of skill in the art and provides for the germanium to silicon ratio in the final $Si_xGe_{1-x}$ film. As described above, once the doped films are formed on the silicon substrate, layers 30 and 40 undergo a conventional photolithography and etching step to form an accessible area on layer 20 for a metallurgical contact. Once a contact area for layer 20 has been formed, a conventional insulating layer 70 such as silicon dioxide or PSG is deposited over the TED device. A second photolithography and etching process is applied to this structure to form contact holes 100 and 110 to layers 20 and 40. After the contact holes 100 and 110 are formed the contacts 50 and 60 can be formed through conventional integrated circuit metallurgy and wiring techniques, such as gold evaporation or wire bonding, as is well known in the art.

The present invention has been described and illustrated with respect to plural embodiments thereof, it will be understood by those skilled in the art that various changes in the detail may be made therein without departing from the spirit, scope, and teaching of the invention. Therefore, the invention disclosed herein is to be limited only as specified in the following claims.

We claim:

1. An integrated transferred electron device, comprising:
  a three layer $Si_xGe_{1-x}$ structure formed on a silicon substrate wherein a first $Si_xGe_{1-x}$ layer is interposed between said silicon substrate and a second $Si_xGe_{1-x}$ layer, said first $Si_xGe_{1-x}$ layer having an N-type doping concentration of approximately at least 10 times greater than said second $Si_xGe_{1-x}$ layer and having a first electrical contact connected thereto, said second $Si_xGe_{1-x}$ layer is interposed between said first $Si_xGe_{1-x}$ layer and a third $Si_xGe_{1-x}$ layer, said third $Si_xGe_{1-x}$ layer having an N-type doping concentration of approximately at least 10 times greater than said second $Si_xGe_{1-x}$ layer and having a second electrical contact connected thereto.

2. An integrated transferred electron device, as in claim 1, wherein:
  x is less than approximately 0.9.

3. An integrated transferred electron device, as in claim 2, wherein:
  said second $Si_xGe_{1-x}$ layer has a thickness in the range of approximately 2,000 to 7,000 Angstroms.

4. An integrated transferred electron device, as in claim 3, wherein:
  said second $Si_xGe_{1-x}$ layer has an N-type doping concentration of less than approximately $5 \times 10^{17}/cm^3$.

5. An integrated transferred electron device, as in claim 3, wherein:
  said first $Si_xGe_{1-x}$ layer is formed on a plane of said silicon substrate substantially perpendicular to a $<100>$ crystal orientation of said silicon substrate.

6. An integrated oscillator circuit, comprising:
  a silicon substrate;
  a three layer $Si_xGe_{1-x}$ structure integrated with said silicon substrate wherein a first $Si_xGe_{1-x}$ layer is interposed between said silicon substrate and a second $Si_xGe_{1-x}$ layer, said first $Si_xGe_{1-x}$ layer having an N-type doping concentration of approximately at least 10 times greater than said second $Si_xGe_{1-x}$ layer and having a first electrical contact connected thereto, said second $Si_xGe_{1-x}$ layer is interposed between said first $Si_xGe_{1-x}$ layer and a third $Si_xGe_{1-x}$ layer, said third $Si_xGe_{1-x}$ layer having an N-type doping concentration of approximately at least 10 times greater than said second $Si_xGe_{1-x}$ layer and having a second electrical contact connected thereto; and
  an RLC network integrated on said silicon substrate and with said three layer $Si_xGe^{1-x}$ structure, said RLC network having an output port for transmitting an oscillating signal.

7. An integrated oscillator circuit, as in claim 6, wherein:
  x is less than approximately 0.9.

8. An integrated oscillator circuit, as in claim 7, wherein:
  said second $Si_xGe_{1-x}$ layer has a thickness in the range of approximately 2,000 to 7,000 Angstroms.

9. An integrated oscillator circuit, as in claim 8, wherein:
  said second $Si_xGe_{1-x}$ layer has an N-type doping concentration of less than approximately $5 \times 10^{17}/cm^3$.

10. An integrated oscillator circuit, as in claim 8, wherein:
  said first $Si_xGe_{1-x}$ layer is formed on a plane of said silicon substrate substantially perpendicular to a $<100>$ crystal orientation of said silicon substrate.

* * * * *